United States Patent
Feng et al.

(10) Patent No.: US 8,796,858 B2
(45) Date of Patent: Aug. 5, 2014

(54) VIRTUALLY SUBSTRATE-LESS COMPOSITE POWER SEMICONDUCTOR DEVICE

(75) Inventors: Tao Feng, Santa Clara, CA (US); Yueh-Se Ho, Sunnyvale, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/488,424

(22) Filed: Jun. 4, 2012

(65) Prior Publication Data

US 2012/0235306 A1    Sep. 20, 2012

Related U.S. Application Data

(62) Division of application No. 12/749,696, filed on Mar. 30, 2010, now Pat. No. 8,242,013.

(51) Int. Cl.
*H01L 23/48* (2006.01)

(52) U.S. Cl.
USPC .............................. 257/774; 438/622; 438/625

(58) Field of Classification Search
CPC ...... H01L 23/5225; H01L 21/76898; H01L 21/76877; H01L 23/481; H01L 23/49827; H01L 23/5384
USPC .................. 257/773, 774, E23.142, E21.585; 438/618–625
See application file for complete search history.

(56) References Cited

U.S. PATENT DOCUMENTS

| | | | | |
|---|---|---|---|---|
| 5,801,419 A | * | 9/1998 | Zommer | 257/341 |
| 2002/0074585 A1 | * | 6/2002 | Tsang et al. | 257/302 |
| 2006/0057836 A1 | * | 3/2006 | Nagarajan et al. | 438/622 |
| 2006/0097380 A1 | * | 5/2006 | Sato | 257/706 |
| 2008/0012119 A1 | * | 1/2008 | Otremba et al. | 257/698 |
| 2009/0166846 A1 | * | 7/2009 | Pratt et al. | 257/698 |

* cited by examiner

*Primary Examiner* — Khiem D Nguyen
(74) *Attorney, Agent, or Firm* — Chein-Hwa Tsao; CH Emily LLC

(57) ABSTRACT

A virtually substrate-less composite power semiconductor device (VSLCPSD) and method are disclosed. The VSLCPSD has a power semiconductor device (PSD), a front-face device carrier (FDC) made out of a carrier material and an intervening bonding layer (IBL). Both carrier and IBL material can be conductive or non-conductive. The PSD has back substrate portion, front semiconductor device portion with patterned front-face device metallization pads and a virtually diminishing thickness $T_{PSD}$. The FDC has patterned back-face carrier metallizations contacting the front-face device metallization pads, patterned front-face carrier metallization pads and numerous parallelly connected through-carrier conductive vias respectively connecting the back-face carrier metallizations to the front-face carrier metallization pads. The FDC thickness $T_{FDC}$ is large enough to provide structural rigidity to the VSLCPSD. The diminishing thickness $T_{PSD}$ effects a low back substrate resistance and the through-carrier conductive vias effect a low front-face contact resistance to the front-face device metallization pads.

13 Claims, 13 Drawing Sheets

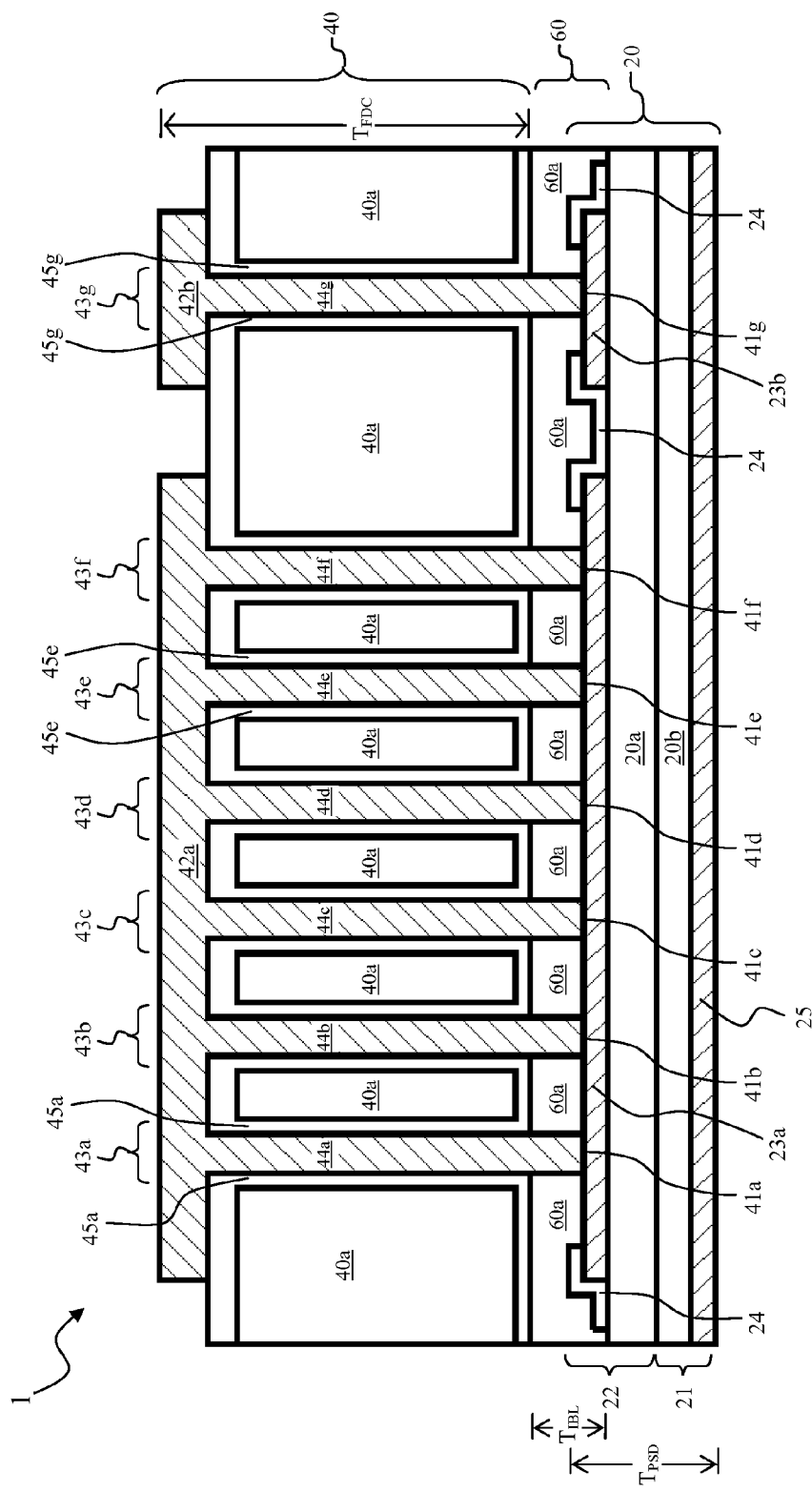
Fig. 1 Present Invention

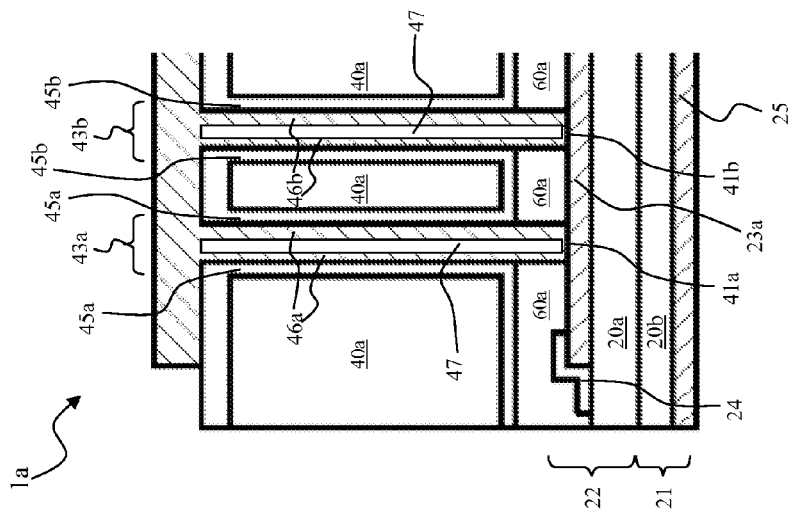
Fig. 1A Present Invention

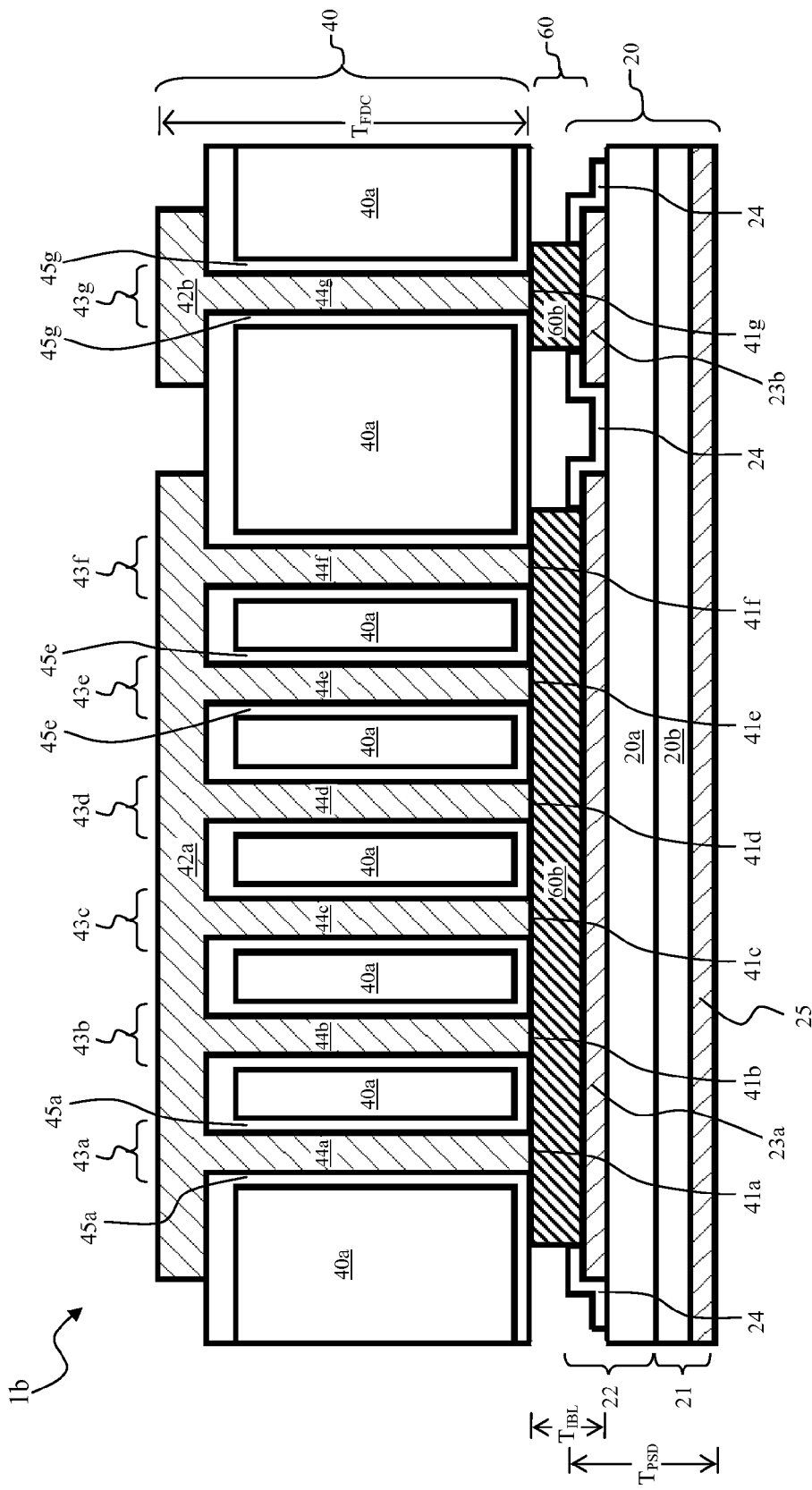
Fig. 1B Present Invention

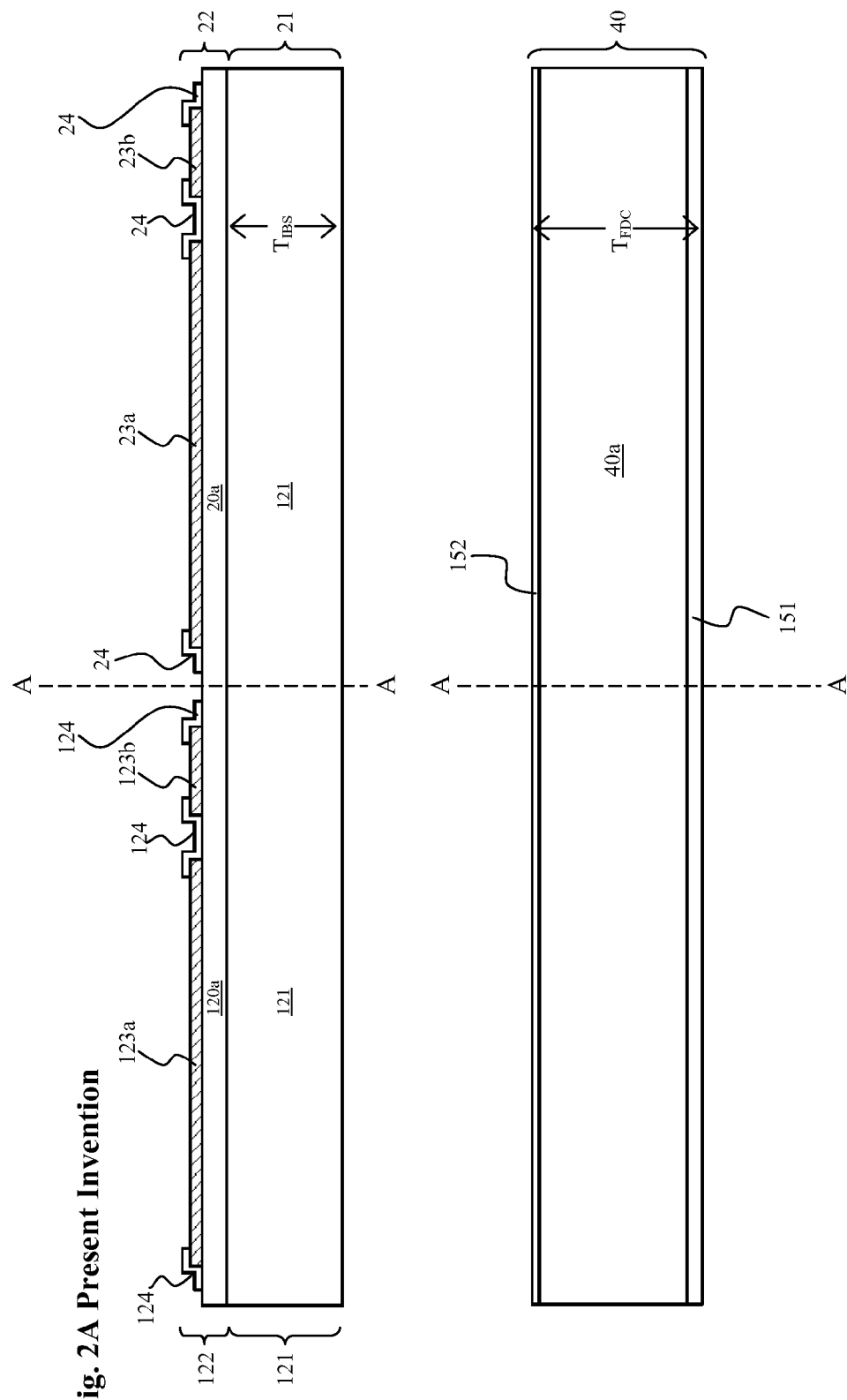
Fig. 2A Present Invention
Fig. 2B Present Invention

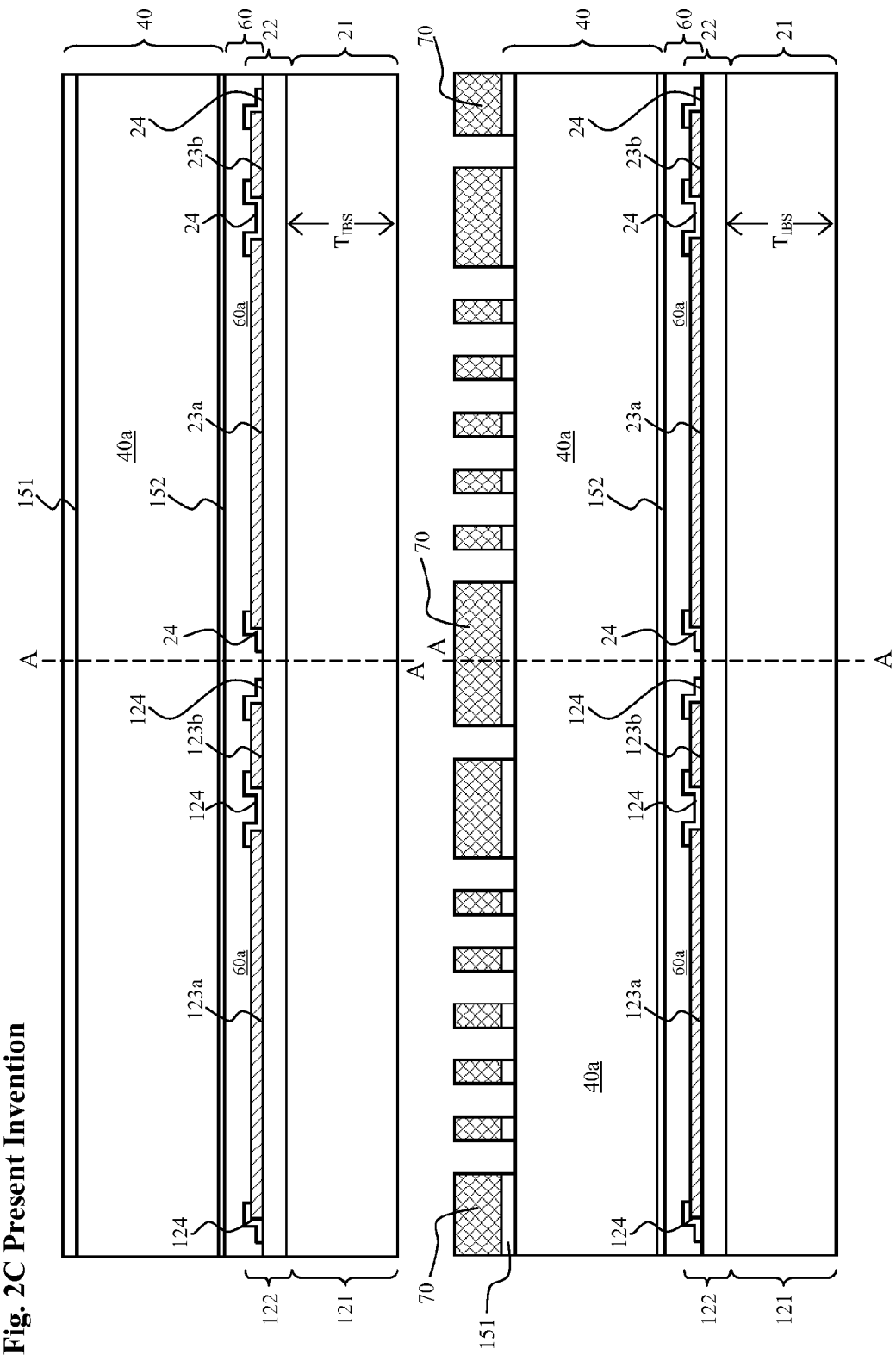
Fig. 2C Present Invention
Fig. 2D Present Invention

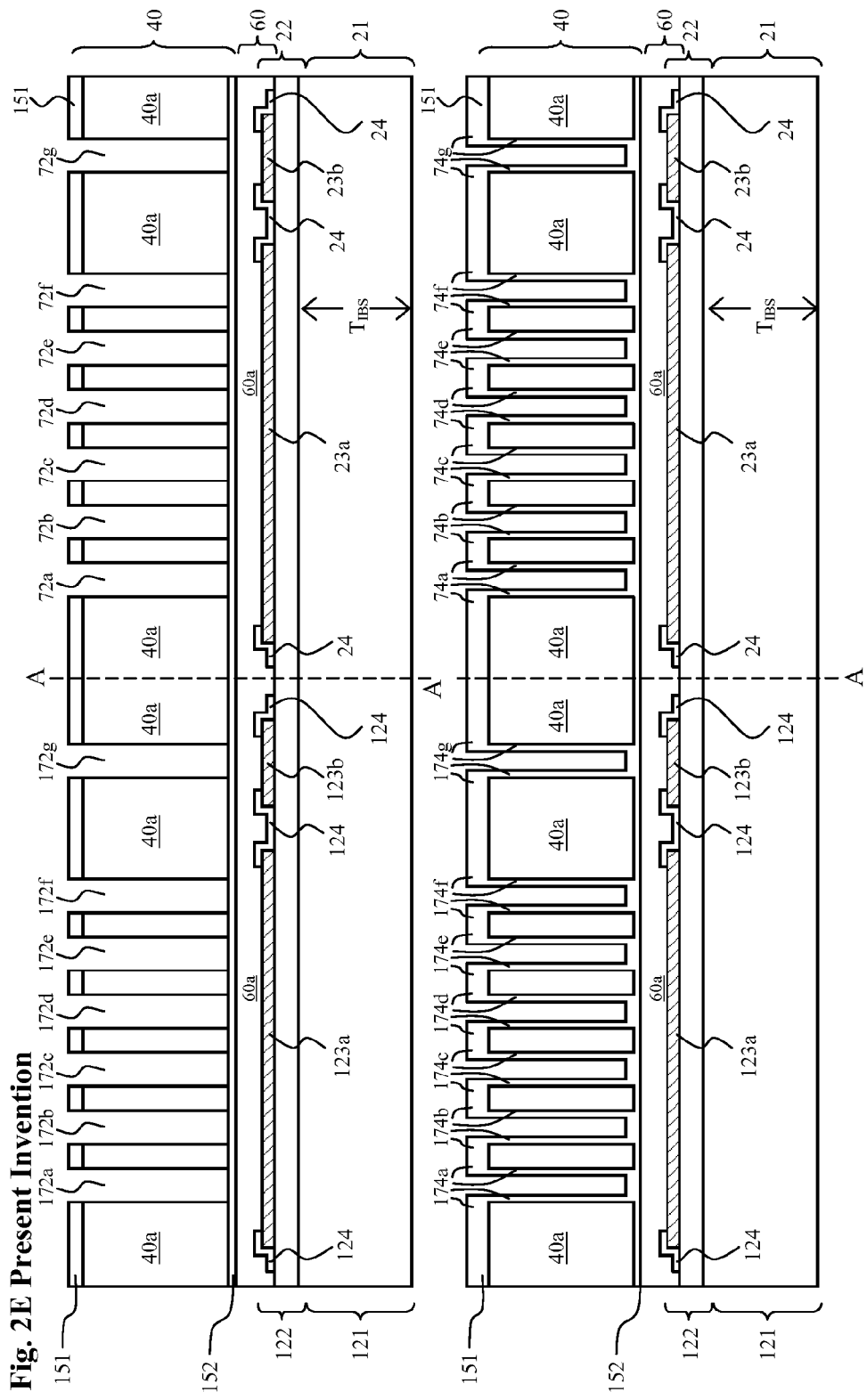

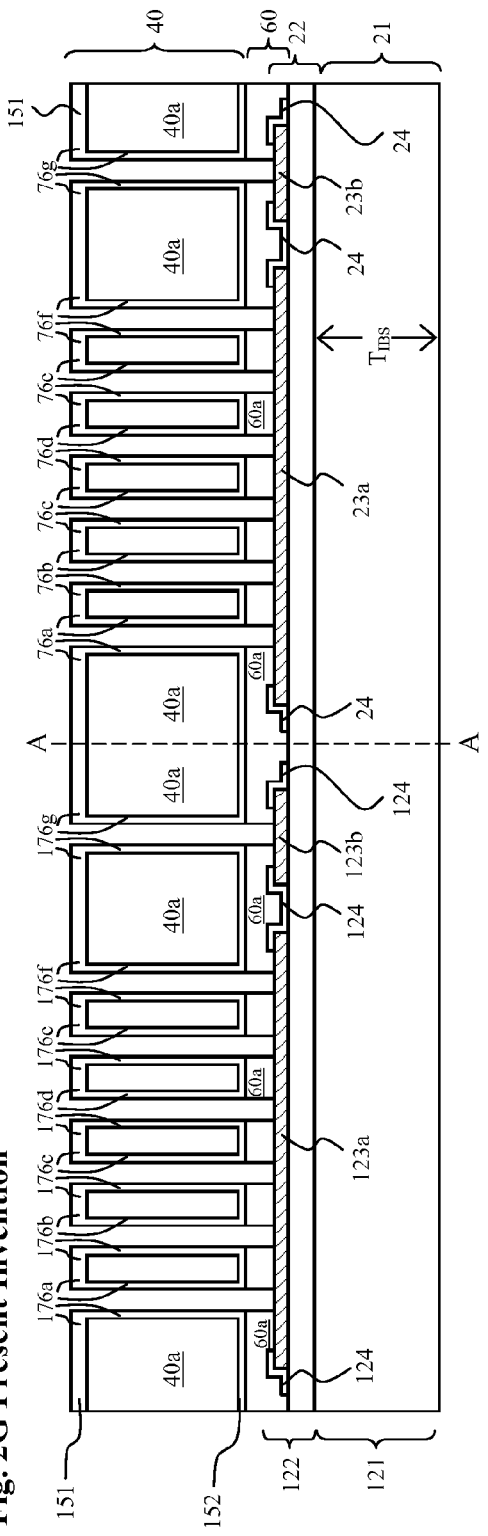
Fig. 2G Present Invention
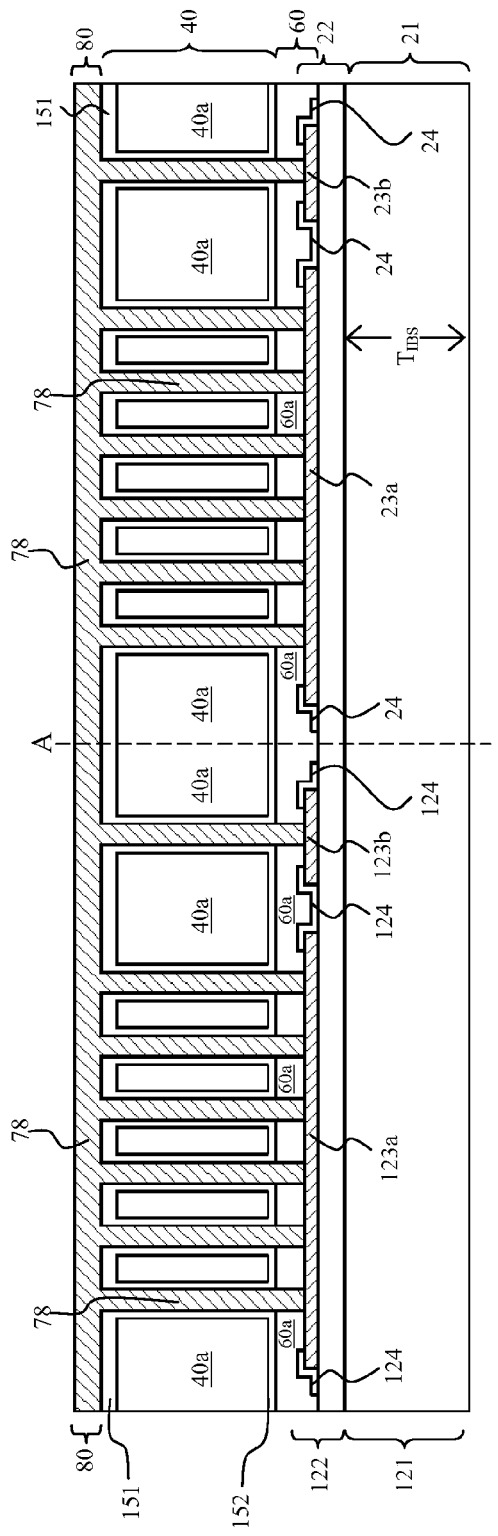
Fig. 2H Present Invention

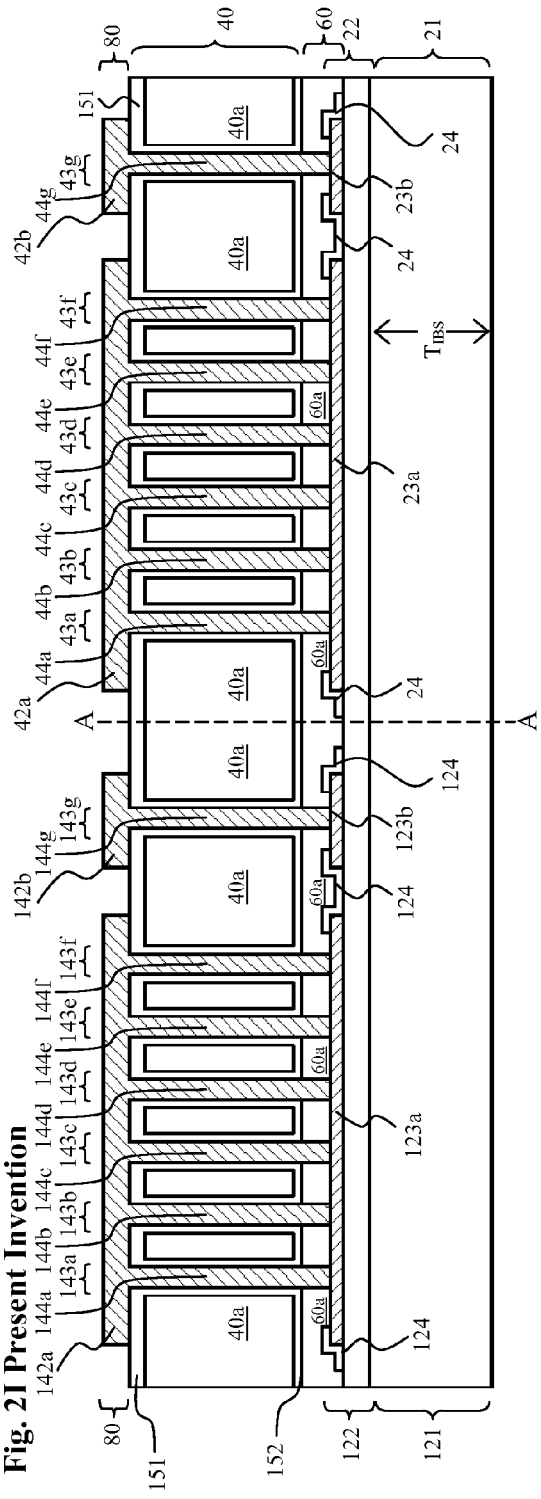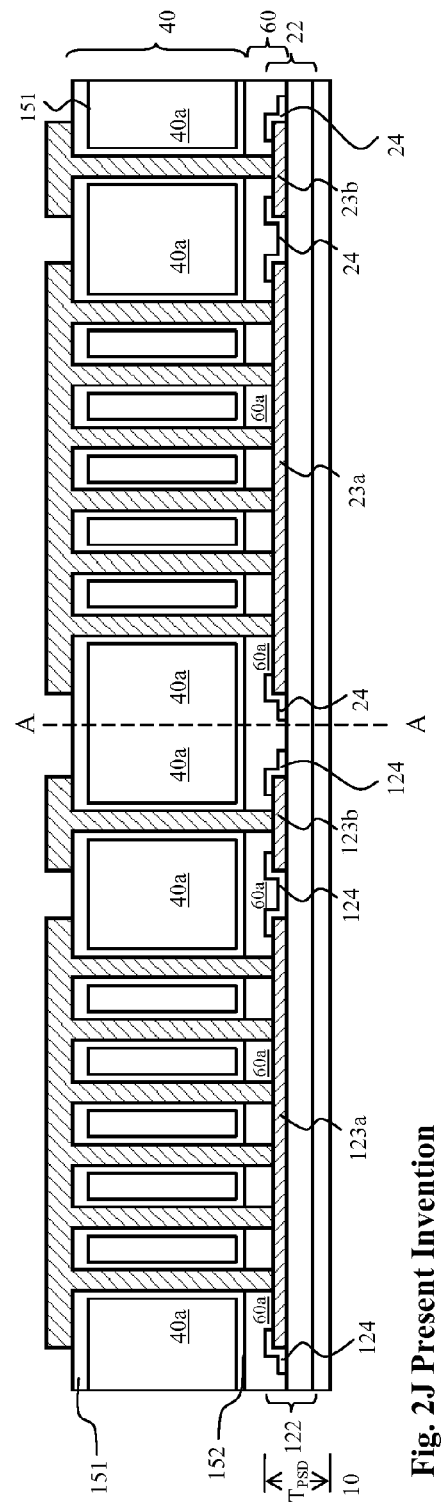
Fig. 2I Present Invention
Fig. 2J Present Invention

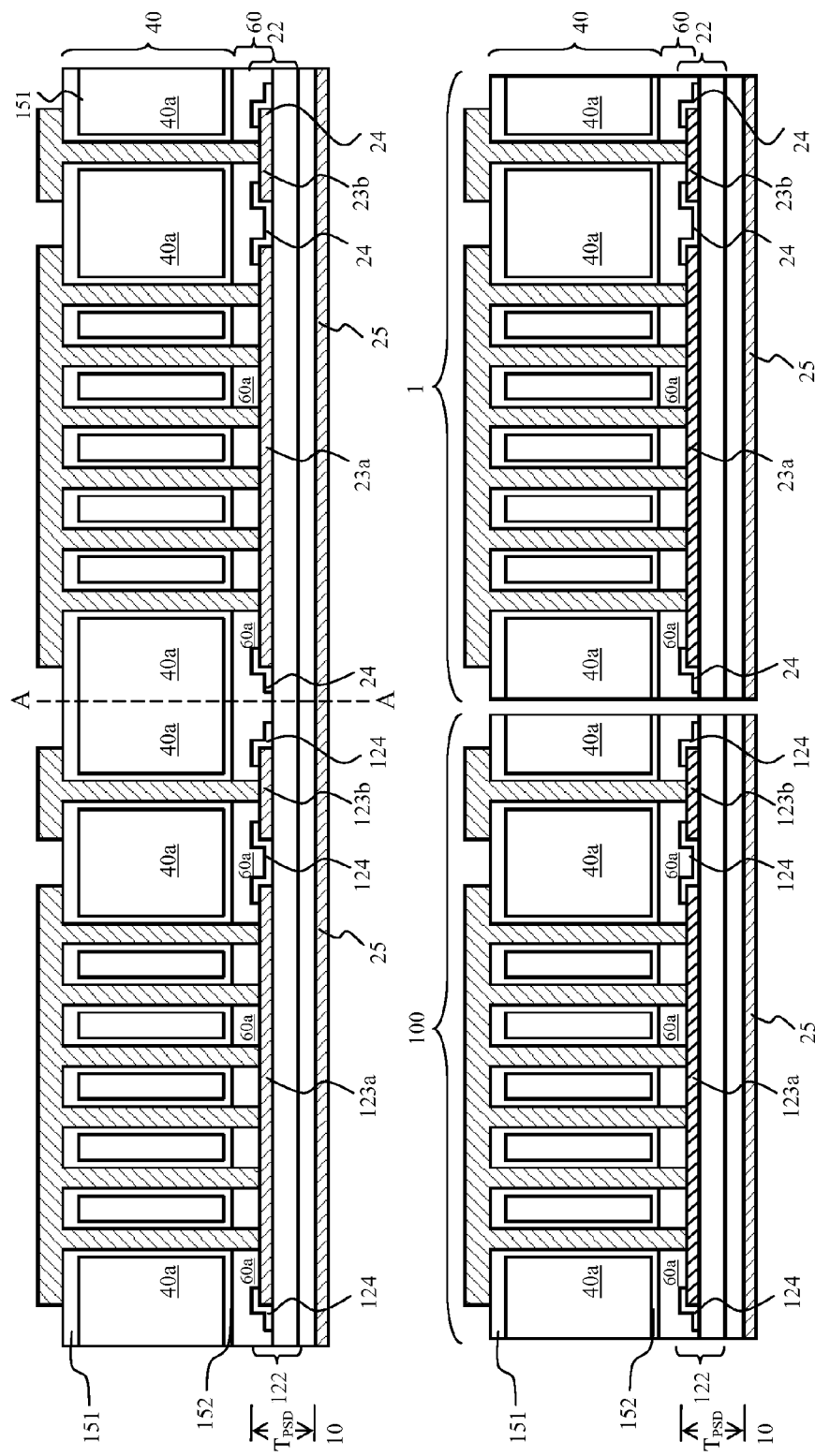

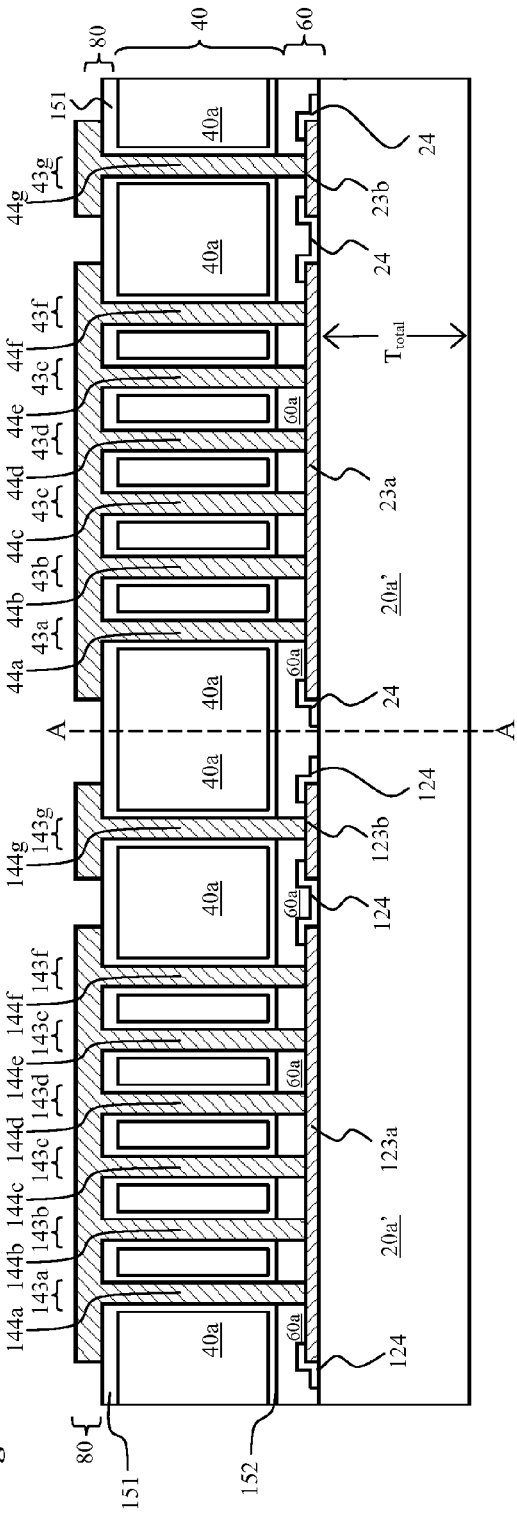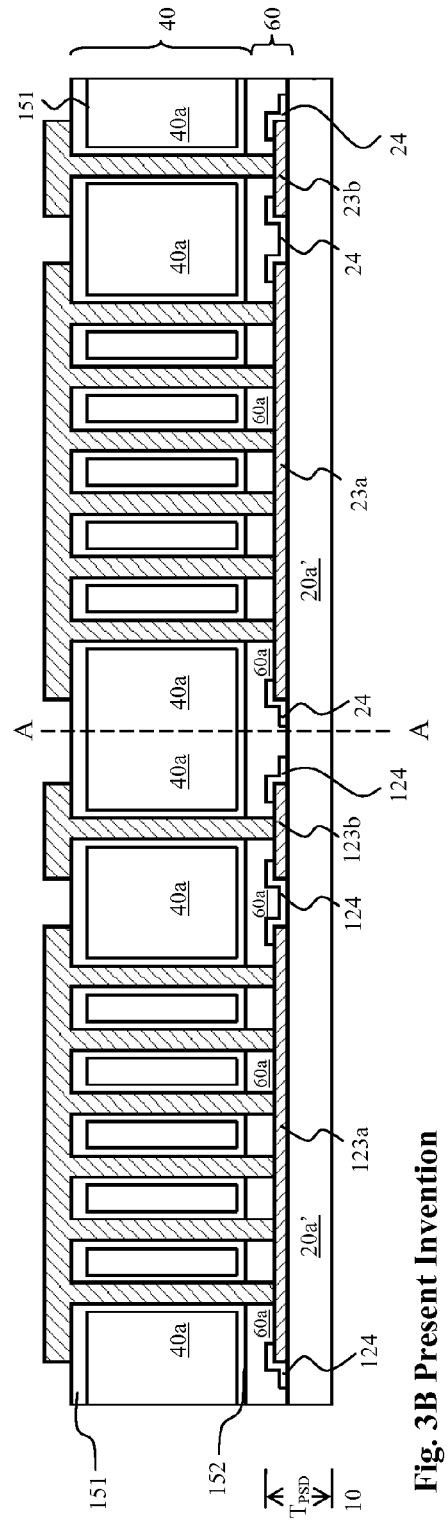
Fig. 3A Present Invention
Fig. 3B Present Invention

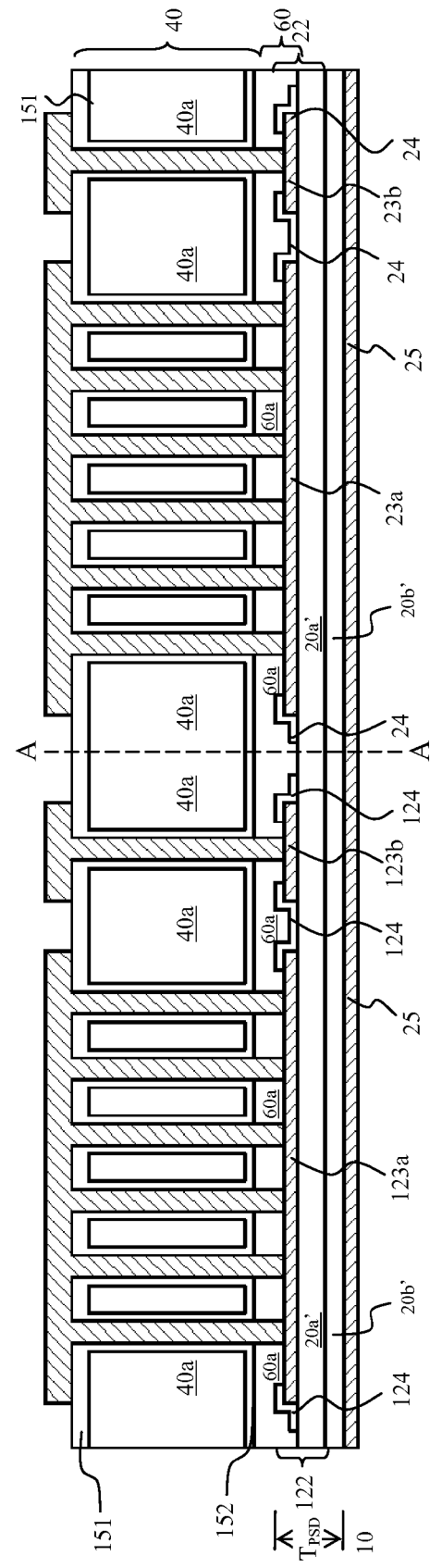
Fig. 3C Present Invention

US 8,796,858 B2

VIRTUALLY SUBSTRATE-LESS COMPOSITE POWER SEMICONDUCTOR DEVICE

CROSS REFERENCE TO RELATED APPLICATIONS

This application is a divisional application of a US patent application entitled "Virtually Substrate-less Composite Power Semiconductor Device and Method" application Ser. No. 12/749,696, filing date: Mar. 30, 2010 issued as U.S. Pat. No. 8,242,013, inventor Tao Feng.

In turn, the application Ser. No. 12/749,696 is related to an earlier patent application entitled "A Method of Forming Ultra Thin Chips of Power Devices", application Ser. No. 11/694,888, filing date: Mar. 30, 2007, abandoned inventor Tao Feng All the above contents are incorporated herein by reference for any and all purposes.

FIELD OF INVENTION

This invention relates generally to the field of semiconductor device structure. More specifically, the present invention is directed to device structure and manufacturing method to form virtually substrate-less chips of power semiconductor devices, such as power Metal-Oxide-Semiconductor Field Effect Transistor (MOSFET) and Insulated Gate Bipolar Transistor (IGBT).

BACKGROUND OF THE INVENTION

As it offers advantages of bulk device electrical resistance reduction, bulk device thermal resistance reduction while maintaining low profile, the ability of making thin chips with a reduced substrate thickness, less than about 10 mils in thickness, of power semiconductor devices has become very desirable in the semiconductor industry. The following is a brief review of some prior arts for making thin semiconductor wafers. Typically semiconductor devices are formed on a wafer having a thick heavily doped substrate, with a thinner epitaxial layer formed on top. The active components of the semiconductor device are formed near the top surface of the wafer, in the epitaxial layer. The thick substrate provides stability and mechanical support for the wafer while it is being processed into semiconductor devices. However, especially for vertical power devices, the substrate adds resistance to the device, even when it is heavily doped. Thus, after front side processing of the wafer is finished, portions of the backside of the substrate are often ground away to thin the substrate. However, as the wafer grows thinner, the wafer becomes more fragile and difficult to handle, especially when the wafer is under 50 microns thick.

In a first prior art example a Dicing Before Grinding (DBG) system for making thin chips is briefly described here. In a first step the front side of a semiconductor wafer is diced, with a dicing blade, to a shallow partial dicing depth defining future individual chips. Next a tape-1 is press rolled onto the diced wafer front surface. Then the semiconductor wafer is flipped upside down and its back side is ground down, with a grinding head, till separation of the individual chips while still held onto tape-1. Next a tape-2 is press rolled onto the diced wafer back surface. Next the semiconductor wafer is flipped again to reveal its front side followed by tape-1 peel-off with the individual chips now held onto tape-2 instead. Then the separated albeit taped chips are transported to a wafer front side stacker for pick up and packaging of the individual chips. Besides being complicated and involving two transfer tapes, the DBG process does not allow for wafer back side processing after the back grinding.

A second prior art example involves a Wafer Support System (WSS) for making thin chips down to around 20 microns. In first step a semiconductor wafer is mounted back side up, with a UV-cured liquid adhesive, onto a stack of light to heat conversion (LTHC) release and support glass. The LTHC release is a coating on the support glass. Next the wafer back side is ground down to a desired thickness with a grinding wheel. While the ground wafer is still held to the assembly, back side semiconductor wafer processing can take place. Afterwards the assembly is flipped over and has its back side bonded onto a dicing tape held by a dicing frame. Next, the LTHC release, due to a focused laser irradiation through the support glass, is detached from the UV-cured liquid adhesive and the support glass. This allows removal of the support glass and peel off of the UV-cured liquid adhesive in following steps to reveal the already thinned wafer for further processing. Despite the advantage of allowing back side semiconductor wafer processing after wafer thinning, there remains the concern of process complication due to potential in-process out gassing from the LTHC release and the UV-cured liquid adhesive. Additionally, the associated proprietary processing equipment can be quite expensive.

FIG. 4 is a top plan view illustrating US patent application 20080207094, entitled "Method and apparatus for ultra thin wafer backside processing" published on Aug. 28, 2008, by Tao Feng et al. The apparatus 100 is for processing the backside 145 of an ultra thin wafer 140. The apparatus 100 comprises an outer ring 110 of generally toroidal configuration that is formed of any rigid material such as metal or a semiconductor. Outer ring 110 may have any configuration and preferably has a rectangular cross section for facilitating the use of the apparatus with a clamp. The outer ring 110 may be sized to accommodate therewithin a wafer 140. In an exemplary embodiment, the outer ring 110 may have an outer diameter of 8 inches to accommodate therewithin a 6-inch wafer. The apparatus 100 further comprises a high temperature grinding and/or dicing tape 120 affixed or otherwise adhered about the outer ring 110 on a bottom surface thereof. The outer ring 110 is operable to provide a holding mechanism for, and rigid support to, the high temperature tape 120. For this purpose, the outer ring 110 may also be formed in, and integrated with, other structures. Tape 120 may include a back grinding and/or dicing tape that can resist the temperatures associated with wafer backside processing such as metallization. During application, an ultra thin wafer or diced wafer is adhered to the high temperature tape 120 within the outer ring 110 for wafer backside processing. The wafer backside processing includes ion implantation, annealing, etching, sputtering and evaporation while the wafer is in the support structure. Despite the advantage of allowing back side semiconductor wafer processing after wafer thinning, there remains the difficulty of handling the wafer when it has been back ground to a very thin level, say, a thickness less than about 2 mils as the semiconductor material can become quite frail. As a result, manufacturing process yield can be impacted.

FIG. 5 and FIG. 6 are respectively a bottom view and a cross sectional view illustrating U.S. Pat. No. 6,162,702, entitled "Self-supported ultra thin silicon wafer process" granted on Dec. 19, 2000. The U.S. Pat. No. 6,162,702 disclosed a silicon wafer 1 having an ultra thin central portion 2 that is supported by a circumferential rim 3 of thicker silicon. The central region is thinned by conventional means using conventional removal apparatus. As an alternative method, the central portion is removed using a photoresist mask or a combination of a photoresist mask, a hard mask and an etch. Along with the previously mentioned prior art, U.S. Pat. No. 6,162,702 can face the difficulty of handling the wafer after it has been thinned to a very low level, say, a thickness less than about 2 mils as the semiconductor material can become quite frail. Another disadvantage is that standard wafer handling equipment has to be modified considering the special structure with the circumferential rim. In summary, there remains the challenge of making ultra thin power semiconductor chips with post-thinning wafer processing steps while avoiding the difficulty of ultra thin wafer handling and usage of nonstandard wafer handling equipment.

SUMMARY OF THE INVENTION

A virtually substrate-less composite power semiconductor device (VSLCPSD) is proposed. The VSLCPSD has:

A sandwich structure having a power semiconductor device (PSD) made out of a semiconductor device material, a front-face device carrier (FDC) made out of a carrier material, and an intervening bonding layer (IBL). The carrier material can be either conductive or non-conductive. Similarly, the IBL can be made of either an insulating or a conductive material.

The PSD has a back substrate portion and a front semiconductor device portion with patterned front-face device metallization pads. In addition, the PSD has a virtually diminishing thickness $T_{PSD}$ in that it is comparable to thickness of the front semiconductor device portion.

The FDC has patterned back-face carrier metallizations contacting the front-face device metallization pads, patterned front-face carrier metallization pads and numerous through-carrier conductive vias respectively connecting the back-face carrier metallizations to the front-face carrier metallization pads. Importantly, the FDC has a thickness $T_{FDC}$ large enough to provide sufficient structural rigidity to the VSLCPSD. On the other hand, the diminishing thickness $T_{PSD}$ effects a low back substrate resistance, and the through-carrier conductive vias effect a low front-face contact resistance to the front-face device metallization pads.

In a more specific embodiment, each through-carrier conductive via is made of a conductive core plus an insulating sleeve surrounding the conductive core to electrically separating the through-carrier conductive vias from each other. The conductive core can be implemented in the form of a conductive layer that lines, through the insulating sleeve, the sidewalls of the through-carrier conductive via.

As an important embodiment, numerous through-carrier conductive vias connecting the back-face carrier metallizations to a single front-face carrier metallization pad are configured to connect one another in parallel in that all the so connected back-face carrier metallizations are configured to contact a single front-face device metallization pad thus further reducing the front-face contact resistance to the front-face device metallization pads.

In a more detailed embodiment, the back-face carrier metallizations are made of an extended portion of through-carrier conductive vias through the IBL.

In a preferred embodiment, the carrier material is chosen to be the same as the semiconductor device material.

In a specific embodiment regarding material, the semiconductor device material is silicon, the IBL is made of silicon oxide or a polymeric material, the polymeric material is BCB (Benzocyclobutene) or polyimide, and all of the front-face carrier metallization pads, the back-face carrier metallizations and the conductive core are made of copper and the insulating sleeve is made of a silicon oxide sleeve.

In a specific embodiment regarding geometry, thickness of the FDC is from about 100 microns to about 400 microns, thickness of the IBL is from about 5 microns to about 30 microns, and thickness of the PSD is from about 5 microns to about 50 microns.

One method of making the proposed VSLCPSD is as follows:

Fabricate the PSD with a conventional semiconductor wafer process on an interim back substrate of thickness $T_{IBS} > T_{PSD}$ and with $T_{IBS}$ large enough for compatibility with the conventional semiconductor wafer process. As an example, $T_{IBS}$ can be selected from about 500 microns to about 800 microns.

Provide the FDC with a thickness $T_{FDC}$ large enough to impart sufficient structural rigidity to the VSLCPSD. As an example, $T_{FDC}$ can be selected from about 100 microns to about 400 microns.

Provide the IBL and bonds FDC to PSD with the IBL thus forming a sandwiched FDC, IBL and PSD.

On the FDC, fabricate numerous front-face carrier metallization pads and numerous through-carrier conductive vias respectively connecting the front-face carrier metallization pads to the front-face device metallization pads.

Thin the interim back substrate from $T_{IBS}$ to $T_{PSD}$ then form back metallization on it.

In a more detailed embodiment, fabricating the front-face carrier metallization pads and through-carrier conductive vias can be carried out as follows:

Mask top surface of the FDC then anisotropically etch out numerous via trenches through bulk of the FDC.

Deposit an insulating material atop and upon all surfaces of the via trenches to form an insulating sleeve enclosing the carrier material.

Anisotropically and sequentially etch out the insulating material and the IBL material.

Simultaneously fill the via trenches and form the front-face carrier metallization pads with a metal.

In a more detailed embodiment, simultaneously filling up the via trenches and forming the front-face carrier metallization pads with a metal are carried out as follows:

Deposit a seed layer upon all exposed surfaces of the FDC.

Plate a thick metal upon the seed layer till the thick metal simultaneously fills up the via trenches and forms a front-face carrier metallization layer. As an example, the thick metal is copper and the seed layer is made of titanium and copper.

Pattern the front-face carrier metallization layer into the front-face carrier metallization pads.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 1 illustrates a cross sectional view of an embodiment of the present invention virtually substrate-less composite power semiconductor device VSLCPSD;

FIG. 1A illustrates a partially cut away cross sectional view of an alternative embodiment of the present invention virtually substrate-less composite power semiconductor device VSLCPSD;

FIG. 1B illustrates a cross sectional view of another alternative embodiment of the present invention virtually substrate-less composite power semiconductor device VSLCPSD;

FIG. 2A through FIG. 2L illustrate a detailed process flow for making the present invention VSLCPSD of FIG. 1; and FIG. 3A through FIG. 3C illustrate an alternative process flow for making the present invention VSLCPSD of FIG. 1.

DETAILED DESCRIPTION OF SPECIFIC EMBODIMENTS

Figure 4:
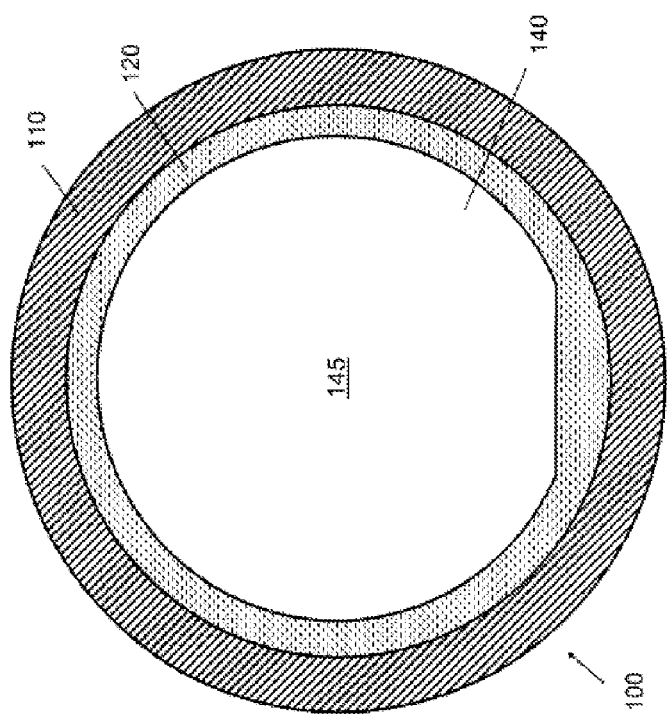
FIG. 4 illustrates US patent application 20080207094 on method and apparatus for ultra thin wafer backside processing.
Figure 5:
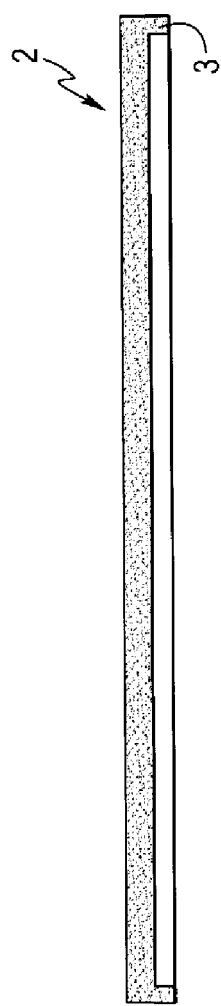
FIG. 5 and FIG. 6 illustrate a prior art U.S. Pat. No. 6,162,702 on self-supported ultra thin silicon wafer process by Morcom et al.
Figure 6:
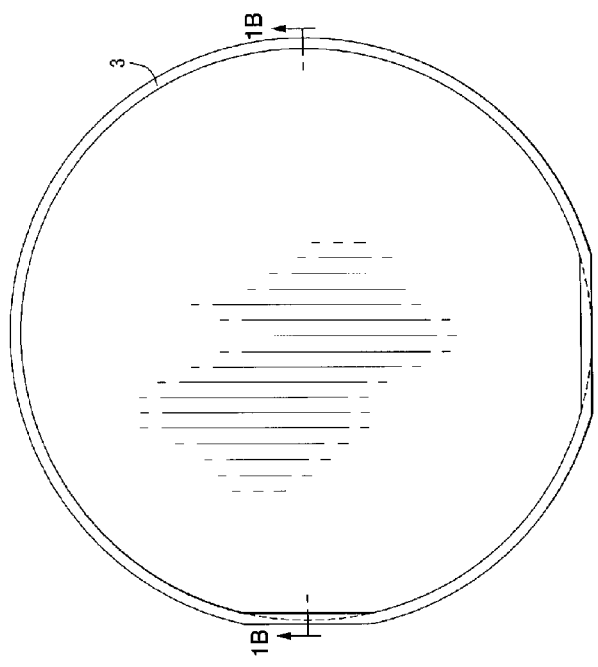

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1 illustrates a cross sectional view of an embodiment of the present invention virtually substrate-less composite power semiconductor device (VSLCPSD) 1. The VSLCPSD 1 has a sandwich structure having a power semiconductor device (PSD) 20, a front-face device carrier (FDC) 40 and an intervening bonding layer (IBL) 60 of thickness $T_{IBL}$ and made of an intervening bonding material 60a. In a specific embodiment, $T_{IBL}$ is from about 5 microns to about 30 microns. The PSD 20 is made out of a semiconductor device material 20a and 20b with a back metallization 25. For example semiconductor device material 20b may be a heavily doped semiconductor substrate and semiconductor device material 20a may be an epitaxial layer formed over the substrate. The FDC 40 is made out of a carrier material 40a that can be either conductive or non-conductive and has a number of patterned front-face carrier metallization pads 42a, 42b. Similarly, the intervening bonding material 60a can be either an insulating or a conductive material as well. In a preferred embodiment, the carrier material 40a is chosen to be the same as the semiconductor device material 20a to simplify the manufacturing of VSLCPSD 1 and to reduce internal device stress generated from differential coefficient of thermal expansion. The PSD 20 has a back substrate portion 21 with semiconductor material 20b and back metallization 25, and a front semiconductor device portion 22 with top passivation 24 and patterned front-face device metallization pads 23a, 23b and semiconductor device material 20a. For example, the patterned front-face device metallization pad 23a can be a source metal pad whereas the front-face device metallization pad 23b can be a gate metal pad. In addition, the PSD 20 has a virtually diminishing thickness $T_{PSD}$ in that it is comparable to the thickness of the front semiconductor device portion 22. For example, thickness of the front semiconductor device portion 22 is typically in the range of several microns while $T_{PSD}$ can be from about 5 microns to about 50 microns. The FDC 40 has patterned back-face carrier metallizations 41a, 41b, 41c, 41d, 41e, 41f, 41g contacting the front-face device metallization pads 23a, 23b, the patterned front-face carrier metallization pads 42a, 42b and numerous parallelly connected through-carrier conductive vias 43a-43f, and through-carrier conductive via 43g respectively connecting the back-face carrier metallizations 41a-41f and back-face carrier metallization 41g to the front-face carrier metallization pads 42a and 42b. The back-face carrier metallizations 41a-41g may be respectively made of an extended portion of the through-carrier conductive vias 43a-43g through the IBL 60. The through-carrier conductive vias 43a-43f are connected in parallel so that connected back-face carrier metallizations 41a-41f are configured to contact a single patterned front-face device metallization pad 23a, for example. In this embodiment, each through-carrier conductive via is made of a solid conductive core plus an insulating sleeve surrounding the solid conductive core to electrically separate the through-carrier conductive vias from each other. For example, through-carrier conductive via 43a is made of a solid conductive core 44a plus an insulating sleeve 45a, through-carrier conductive via 43b is made of a solid conductive core 44b plus an insulating sleeve 45b, . . . , through-carrier conductive via 43g is made of a solid conductive core 44g plus an insulating sleeve 45g. It is important to point out that, given the virtually diminishing thickness $T_{PSD}$ of the PSD 20, the FDC 40 should be made with a thickness $T_{FDC}$ large enough to provide sufficient structural rigidity to the VSLCPSD 1 for handling during its manufacturing process and this will be presently described. For example, $T_{FDC}$ can be selected from about 100 microns to about 400 microns. By now it should become clear to those skilled in the art that the present invention VSLCPSD 1 provides the following performance advantages to the PSD 20:

The diminishing thickness $T_{PSD}$ effects a low back substrate resistance (both electrical and thermal). The parallelly connected through-carrier conductive vias 43a-43f and through-carrier conductive via 43g effect a low front-face contact resistance to the front-face device metallization pads 23a, 23b, while allowing the FDC 40 to provide mechanical support to the structure VSLCPSD 1.

In a specific embodiment regarding material selection, the semiconductor device material 20a and 20b is silicon, the IBL 60 is made of silicon oxide or a polymeric material such as BCB (Benzocyclobutene) or polyimide. The front-face carrier metallization pads 42a, 42b, the back-face carrier metallizations 41a-41g and the solid conductive cores 44a-44g are made of copper and the insulating sleeves 45a-45g are made of silicon oxide. In an embodiment where the carrier material 40a of the FDC 40 is already made of an insulating material, the insulating sleeves 45a-45g are not necessary.

FIG. 1A illustrates, to simplify viewing, a partially cut away cross sectional view of an alternative embodiment of the present invention VSLCPSD 1a. The VSLCPSD 1a is the same as VSLCPSD 1 except for a slight structural variation of the through-carrier conductive vias. Instead of a solid conductive core, through-carrier conductive vias 43a, 43b of the VSLCPSD 1a are respectively made of hollow shell conductive cores 46a, 46b plus the insulating sleeves 45a, 45b. Thus, the shell conductive core 46a is a conductive layer that lines, through the insulating sleeve 45a, the sidewalls of the through-carrier conductive via 43a, etc. This leaves an empty space 47 at the center of hollow shell conductive cores 46a, 46b. While a shell conductive core exhibits an electrical resistance higher than that of a solid conductive core made of the same material, for as long as the shell conductive core resistance is still much lower than the device internal resistance of the PSD 20 a low front-face contact resistance to the front-face device metallization pads 23a, 23b is still maintained. Under this situation, the shell conductive core can provide the advantages of reduced material consumption and reduced built-in material stress and may be simpler to manufacture compared to an otherwise solid conductive core.

FIG. 1B illustrates a cross sectional view of another alternative embodiment of the present invention VSLCPSD 1b. The VSLCPSD 1b is the same as VSLCPSD 1 except that the IBL 60 comprises conductive material 60b (such as copper) on top of front-face device metallization pads 23a, 23b. In this embodiment the patterned back-face carrier metallizations 41a, 41b, 41c, 41d, 41e, 41f, 41g contact the front-face device metallization pads 23a, 23b through the conductive IBL 60. The conductive material 60b can also be a conductive adhesive material such as solder, or eutectic bond alloys, or simply the interface of a direct copper to copper bonding.

FIG. 2A through FIG. 2L illustrate a detailed process flow for fabricating the present invention VSLCPSD of FIG. 1. In FIG. 2A, two PSD dies, separated along a demarcation line A-A, are fabricated with a conventional semiconductor wafer process on a semiconductor substrate 121 of thickness $T_{IBS} > T_{PSD}$. $T_{IBS}$ should be made large enough for compatibility with the conventional semiconductor wafer process. As an example, $T_{ms}$ can be selected from about 500 microns to about 800 microns to be able to withstand the stresses involved with conventional semiconductor wafer processes. The PSD to the left of demarcation A-A has a front semiconductor device portion 122 that in turn includes semiconductor layer 120a, front-face device metallization pads 123a, 123b and top passivation 124. Other detailed components of the front semiconductor device portion 122, such as source and gate regions, etc., are omitted here to avoid unnecessary obscuring details as they are well known in the art. However it should be noted that the active parts of the semiconductor device are formed near the top surface of the device, i.e., primarily near the top surface of semiconductor layer 120a. Similarly, the PSD to the right of demarcation A-A has a front semiconductor device portion 22 that in turn includes front-face device metallization pads 23a, 23b, top passivation 24 and semiconductor layer 20a. As will be presently illustrated, the two PSD cells will be separated into individual VSLCPSD units from each other near the end of the fabrication process. Thus, the present invention is applicable to the individual as well as batch fabrication of VSLCPSD units. In FIG. 2B an FDC 40 is supplied with carrier front-face oxide 151, carrier back-face oxide 152 and a thickness $T_{FDC}$ large enough to impart sufficient structural rigidity to the VSLCPSD 1. As already mentioned before, $T_{FDC}$ can be selected from about 100 microns to about 400 microns.

In FIG. 2C the FDC 40 is bonded to the front side of the PSD dies (including fabricated front semiconductor device portions 122, 22) via a separately supplied IBL 60 thus forming a sandwiched FDC, IBL and PSD. By way of example, the IBL 60 may be made of a polymeric material such as BCB formed over the front side of the PSD 21, and the back-face oxide 152 of the FDC 40 may be attached to top of the IBL 60. Alternatively, the IBL 60 may be formed partially over the front side of the PSD 21 and partially on the back-face oxide 152 before putting the two parts together.

FIG. 2D through FIG. 2I illustrate the next portion of process flow wherein numerous front-face carrier metallization pads (left PSD cell: 142a, 142b, right PSD cell: 42a, 42b) and numerous through-carrier conductive vias (left PSD cell: 143a-143g, right PSD cell: 43a-43g) respectively connecting the front-face carrier metallization pads to the front-face device metallization pads (left PSD cell: 123a, 123b, right PSD cell: 23a, 23b) are fabricated on the FDC 40. As the structure and process of the left PSD cell and the right PSD cell are the same, from now on the process flow will only be described for the right PSD cell for simplicity.

In FIG. 2D top surface of the FDC 40 is masked with a patterned photoresist 70 then anisotropically etched out thus patterning the carrier front-face oxide 151 till termination at the carrier material 40a thus forming a hard mask out of the oxide 151. The photoresist 70 is then stripped off. In FIG. 2E the bulk of FDC carrier material 40a is anisotropically etched out, through the patterned carrier front-face oxide 151, till termination at carrier back-face oxide 152 thus creating numerous via trenches 72a-72g.

In FIG. 2F an insulating material, for example silicon oxide or a polymeric material, is deposited atop and upon all surfaces of the via trenches 72a-72g to form insulating sleeves 74a-74g enclosing the carrier material 40a. In FIG. 2G the insulating sleeves 74a-74g and the intervening bonding material 60a are anisotropically and sequentially etched out, for example via plasma etching, till termination at front-face device metallization pads 23a, 23b thus creating anisotropically etched sleeves 76a-76g. During the anisotropic etching of the insulating sleeves 74a-74g, only the bottom of the sleeves is etched away, leaving insulating material on the sidewalls of carrier material 40a. By way of example and not by way of limitation, the IBL 60 may be made of a material that can then be preferentially etched compared to the carrier front face dielectric 151 and the insulating sleeves 76a-76g.

FIG. 2H through FIG. 2I illustrate the next portion of process flow wherein the via trenches 72a-72g are filled and the patterned front-face carrier metallization pads 42a, 42b are formed with a metal. In FIG. 2H a seed layer (not shown) is deposited upon all exposed surfaces of the FDC 40. A thick metal 78 is then plated upon the seed layer till the plated thick metal 78 simultaneously fills up the via trenches 72a-72g and forms a front-face carrier metallization layer 80. As a material example, the thick metal is copper and the seed layer is made of titanium and copper. Optionally, the top surface of the plated thick metal 78 can be planarized with chemical mechanical polishing (CMP) and the semiconductor device-in-progress annealed to relieve its internal stress. In FIG. 2I the front-face carrier metallization layer 80 is patterned, using a photoresist (not shown here), into the front-face carrier metallization pads 42a, 42b. By now the numerous through-carrier conductive vias 43a-43g are completed as well.

In FIG. 2J the bottom part of the semiconductor substrate 121 may be thinned down using a variety of methods such as mechanical grinding, chemical etching or CMP, for the PSD 20 to reach its desired thickness $T_{PSD}$. For example, this method allows the semiconductor material in PSD 20 to be ground to less than 50 microns, without becoming overly fragile, owing to the structural support provided by FDC 40. In extreme cases, the semiconductor substrate 121 may even be completely ground away leaving only the semiconductor layer 20a, although it may be better to leave a small portion of the highly doped substrate 121 for making good electrical contact with the back metal. As an alternative to get around this issue, the ground bottom of the semiconductor layer 20a can be doped with high doping concentration before formation of the back metal. In FIG. 2K back metallization 25 is formed at the bottom of the semiconductor device-in-progress. In FIG. 2L the device-in-progress is finally separated along the demarcation A-A, for example via a dicing process, into a VSLCPSD 1 and a VSLCPSD 100.

As mentioned before, the fact that:

FDC 40 is made with a thickness $T_{FDC}$ large enough to provide sufficient structural rigidity to the VSLCPSD 1 for handling during its manufacturing process advantageously allows easy, reliable fabrication steps after the PSD 20 has been thinned down to its desired thickness $T_{PS}$. Notwithstanding this large enough $T_{FDC}$, the inclusion of multiple, parallelly connected through-carrier conductive vias 43a-43f and through-carrier conductive via 43g can still effect a low front-face contact resistance to the front-face device metallization pads 23a, 23b as if the FDC 40 were made much thinner. It should also become clear to those skilled in the art by now, given the described process flow for fabricating the present invention VSLCPSD, that standard wafer handling equipment can advantageously be used throughout the process.

While the description above contains many specificities, these specificities should not be construed as accordingly limiting the scope of the present invention but as merely providing illustrations of numerous presently preferred embodiments of this invention. For example, in addition to MOSFET, the present invention expects to be applicable to vertical power semiconductor devices in general where the device current flows primarily between its front-face and back substrate, such as an Insulated Gate Bipolar Transistor (IGBT). For another example, given that easy and reliable fabrication steps can take place after the PSD 20 has been thinned down to its desired thickness, a single, lightly doped substrate layer 20a' can initially be used, in lieu of a top semiconductor material 20a with a semiconductor substrate 121, having a thickness $T_{total}$ as shown in FIG. 3A (which is otherwise the same as FIG. 2I). Following the thinning of the single lightly doped substrate 20a' shown in FIG. 3B, the bottom of the single lightly doped substrate 20a' can then be implanted to form a highly doped surface layer 20b' for contacting the back metallization 25 as shown in FIG. 3C.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A substrate-less composite power semiconductor device (VSLCPSD) comprising:
    a sandwich structure comprising a power semiconductor device (PSD) made out of a semiconductor device material, a front-face device carrier (FDC) made out of a carrier material, and an intervening bonding layer (IBL) between the PSD and the FDC, wherein the PSD is a vertical power semiconductor device (VPSD) with a back metallization covering the entire back surface of the VPSD forming a major electrode on its back surface, wherein the IBL covers the entire front surface of the PSD and the entire IBL is sandwiched between the PSD and the FDC;
    the PSD having a back substrate portion and a front semiconductor device portion with two or more patterned front-face device metallization pads separated by a top passivation, the PSD further having a thickness TPSD comparable to a thickness of the front semiconductor device portion; and
    the FDC having two or more patterned front-face carrier metallization pads and a plurality of through-carrier conductive vias respectively electrically connecting the front-face carrier metallization pads to the front-face device metallization pads, wherein the through-carrier conductive vias penetrate through the IBL.

2. The VSLCPSD of claim 1 wherein the IBL is made of an insulating material or a conductive material.

3. The VSLCPSD of claim 1 wherein each through-carrier conductive via comprises a conductive core and an insulating sleeve surrounding the conductive core and electrically separating the through-carrier conductive vias from each other.

4. The VSLCPSD of claim 3 wherein the conductive core comprises a conductive layer lining the sidewalls of the through-carrier conductive via.

5. The VSLCPSD of claim 1 wherein numerous through-carrier conductive vias connecting back-face carrier metallizations to a single front-face carrier metallization pad are connected in parallel in that all the so connected back-face carrier metallizations are configured to contact a single front-face device metallization pad whereby further reducing the front-face contact resistance to the front-face device metallization pads.

6. The VSLCPSD of claim 1 wherein the back-face carrier metallizations are made of an extended portion of through-carrier conductive vias through the IBL.

7. The VSLCPSD of claim 1 wherein the carrier material is the same as the semiconductor device material.

8. The VSLCPSD of claim 7 wherein the semiconductor device material is silicon.

9. The VSLCPSD of claim 8 wherein the IBL is made of silicon oxide or a polymeric material.

10. The VSLCPSD of claim 9 wherein the polymeric material is BCB (Benzocyclobutene) or polyimide.

11. The VSLCPSD of claim 3 wherein all of the front-face carrier metallization pads, the back-face carrier metallizations and the conductive cores are made of copper and the insulating sleeve is made of a silicon oxide.

12. The VSLCPSD of claim 1 wherein:
    the semiconductor device material is silicon;
    thickness of the FDC is from about 100 microns to about 400 microns;
    thickness of the IBL is from about 5 microns to about 30 microns; and
    thickness of the PSD is from about 5 microns to about 50 microns.

13. The VSLCPSD of claim 1 wherein:
    the semiconductor device material is silicon; and
    thickness of the semiconductor material in PSD is less than 50 microns.

* * * * *